United States Patent
Park et al.

(10) Patent No.: US 12,476,160 B2
(45) Date of Patent: Nov. 18, 2025

(54) SEMICONDUCTOR PACKAGE AND METHOD OF FABRICATING THE SAME

(71) Applicant: Samsung Electronics Co., Ltd., Suwon-si (KR)

(72) Inventors: Jiyoung Park, Suwon-si (KR); Yeongkwon Ko, Suwon-si (KR); Hosin Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 438 days.

(21) Appl. No.: 18/067,060

(22) Filed: Dec. 16, 2022

(65) Prior Publication Data

US 2023/0386949 A1 Nov. 30, 2023

(30) Foreign Application Priority Data

May 31, 2022 (KR) .................. 10-2022-0066933

(51) Int. Cl.
*H01L 23/48* (2006.01)
*H01L 21/56* (2006.01)
(Continued)

(52) U.S. Cl.
CPC ........ *H01L 23/3128* (2013.01); *H01L 21/568* (2013.01); *H01L 23/3135* (2013.01); *H01L 23/49822* (2013.01); *H01L 24/24* (2013.01); *H01L 25/105* (2013.01); *H01L 24/16* (2013.01); *H01L 24/32* (2013.01); *H01L 24/73* (2013.01); *H01L 2224/16227* (2013.01); *H01L 2224/24101* (2013.01); *H01L 2224/24155* (2013.01); *H01L 2224/244* (2013.01); *H01L 2224/245* (2013.01); *H01L 2224/24991* (2013.01); *H01L 2224/24996* (2013.01); *H01L 2224/32225* (2013.01);
(Continued)

(58) Field of Classification Search
None
See application file for complete search history.

(56) References Cited

U.S. PATENT DOCUMENTS

| 7,737,543 B2 | 6/2010 | Jobetto et al. |
| 9,006,888 B2 * | 4/2015 | Shim ................. H01L 23/3128 257/737 |

(Continued)

FOREIGN PATENT DOCUMENTS

| KR | 102058247 B1 | 1/2020 |
| KR | 20230001758 A | 1/2023 |

Primary Examiner — Nicholas J Tobergte
(74) Attorney, Agent, or Firm — Wolf, Greenfield & Sacks, P.C.

(57) ABSTRACT

A semiconductor package includes a semiconductor chip on a redistribution substrate and including a body, a chip pad on the body, and a pillar on the chip pad, a connection substrate including base layers and a lower pad on a bottom surface of a lowermost one of the base layers, a first passivation layer between the semiconductor chip and the redistribution substrate, and a dielectric layer between the redistribution substrate and the connection substrate. The first passivation layer and the dielectric layer include different materials from each other. A bottom surface of the pillar, a bottom surface of the first passivation layer, a bottom surface of a molding layer, a bottom surface of the lower pad, and a bottom surface of the dielectric layer are coplanar with each other.

14 Claims, 12 Drawing Sheets

(51) Int. Cl.
  *H01L 23/00*     (2006.01)
  *H01L 23/31*     (2006.01)
  *H01L 23/498*    (2006.01)
  *H01L 25/10*     (2006.01)

(52) U.S. Cl.
  CPC .............. *H01L 2224/73204* (2013.01); *H01L 2225/1035* (2013.01); *H01L 2225/1058* (2013.01); *H01L 2924/01029* (2013.01); *H01L 2924/0105* (2013.01)

(56) References Cited

U.S. PATENT DOCUMENTS

| | | | |
|---|---|---|---|
| 9,087,832 B2 * | 7/2015 | Huang | H01L 23/5389 |
| 9,502,391 B2 | 11/2016 | Kwon et al. | |
| 9,859,245 B1 * | 1/2018 | Chen | H01L 21/6835 |
| 9,875,911 B2 * | 1/2018 | Pagaila | H01L 21/56 |
| 10,062,652 B2 | 8/2018 | Lee et al. | |
| 10,170,382 B2 | 1/2019 | Kim et al. | |
| 10,217,709 B2 | 2/2019 | Kang et al. | |
| 10,622,273 B2 | 4/2020 | Choi et al. | |
| 10,811,379 B2 | 10/2020 | Kim et al. | |
| 11,469,215 B2 * | 10/2022 | Chen | H01L 21/6835 |
| 11,569,158 B2 * | 1/2023 | Kang | H01L 21/568 |
| 12,261,105 B2 * | 3/2025 | Kang | H01L 24/16 |
| 2011/0068459 A1 * | 3/2011 | Pagaila | H01L 21/56 |
| | | | 257/E23.141 |
| 2014/0252646 A1 * | 9/2014 | Hung | H01L 23/3128 |
| | | | 257/774 |
| 2018/0102322 A1 * | 4/2018 | Kang | H01L 24/19 |
| 2018/0151500 A1 * | 5/2018 | Chen | H01L 21/4857 |
| 2020/0135708 A1 * | 4/2020 | Chen | H01L 23/5389 |
| 2021/0143118 A1 | 5/2021 | Joo et al. | |
| 2022/0102257 A1 * | 3/2022 | Kim | H01L 23/3185 |
| 2022/0415838 A1 * | 12/2022 | Lee | H01L 24/20 |

* cited by examiner

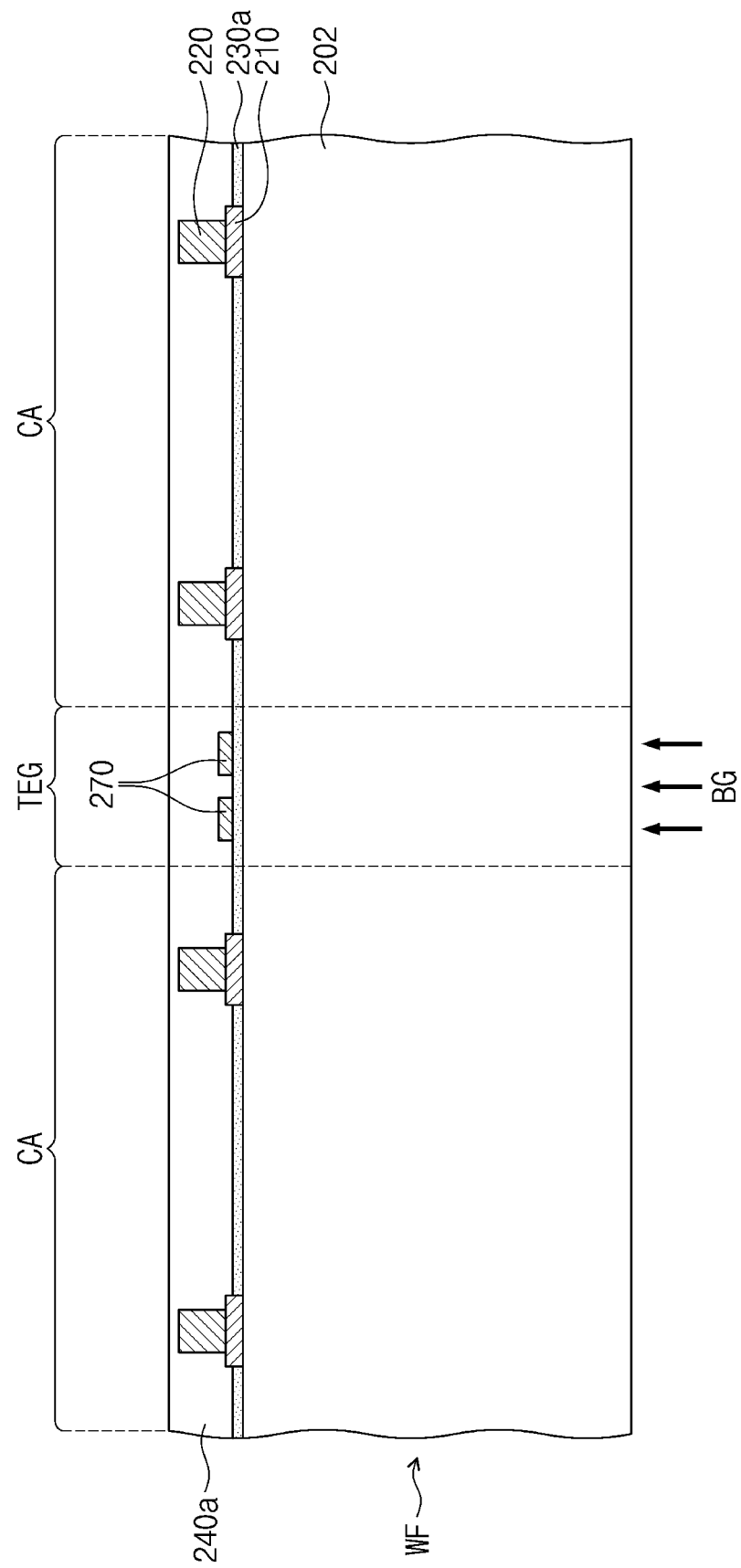

SEMICONDUCTOR PACKAGE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0066933, filed on May 31, 2022 in the Korean Intellectual Property Office, the disclosure of which is hereby incorporated by reference in its entirety.

BACKGROUND

The present inventive concepts relate to a semiconductor package and a method of fabricating the same.

A semiconductor package is provided to implement an integrated circuit chip for use in electronic products. In typical, a semiconductor package is configured such that a semiconductor chip is mounted on a printed circuit board (PCB) and bonding wires or bumps are used to electrically connect the semiconductor chip to the printed circuit board. With the recent advances in the electronic industry, the semiconductor package is variously developed to reach the goal of compact size, small weight, and/or low manufacturing cost. In addition, many kinds of semiconductor packages are developed with the expansion of their application field such as high-capacity mass storage devices.

SUMMARY

Some embodiments of the present inventive concepts provide a highly reliable semiconductor package and a method of fabricating the same.

Some embodiments of the present inventive concepts provide a semiconductor package and a method of fabricating the same, which method easily or efficiently forms fine patterns of a redistribution substrate.

According to some embodiments of the present inventive concepts, a semiconductor package may include: a redistribution substrate; a semiconductor chip on the redistribution substrate, the semiconductor chip including a body, a chip pad on a bottom surface of the body, and a pillar on a bottom surface of the chip pad; a connection substrate on the redistribution substrate and surrounding the semiconductor chip, the connection substrate including base layers and a lower pad on a bottom surface of a lowermost one of the base layers; a first passivation layer between the semiconductor chip and the redistribution substrate, the first passivation layer covering a side surface of the pillar; a molding layer at least partially covering the semiconductor chip, the connection substrate, and the redistribution substrate; and a dielectric layer between the redistribution substrate and the connection substrate, the dielectric layer covering a side surface of the lower pad. The first passivation layer and the dielectric layer may include different materials from each other. A bottom surface of the pillar, a bottom surface of the first passivation layer, a bottom surface of the molding layer, a bottom surface of the lower pad, and a bottom surface of the dielectric layer may be coplanar with each other.

According to some embodiments of the present inventive concepts, a method of fabricating a semiconductor package may include: preparing a connection substrate including a through hole and a lower pad, the lower pad protruding from a surface of the connection substrate; preparing a semiconductor chip and a passivation layer on an active surface of the semiconductor chip, the semiconductor chip including a chip pad on the active surface and a pillar extending from the chip pad, and the passivation layer covering the pillar; placing the semiconductor chip in the through hole; forming a mold layer that covers the semiconductor chip and the connection substrate; forming a dielectric layer that covers the lower pad; and performing a surface planarization on the passivation layer and the dielectric layer until the pillar and the lower pad are exposed.

According to some embodiments of the present inventive concepts, a semiconductor package may include: a first semiconductor package; and a second semiconductor package on the first semiconductor package. The first semiconductor package may include: a first redistribution substrate; a first semiconductor chip on the first redistribution substrate, the first semiconductor chip including a body that includes a first surface adjacent the first redistribution substrate and an opposite second surface, a chip pad on the first surface of the body, a first passivation layer at least partially covering the first surface of the body and a side surface of the chip pad, and a pillar below the chip pad; a second passivation layer between the first semiconductor chip and the first redistribution substrate, the second passivation layer covering a side surface of the pillar; a connection substrate on the first redistribution substrate, the connection substrate surrounding the first semiconductor chip; a first molding layer at least partially covering the first semiconductor chip, the connection substrate, and the first redistribution substrate; and a second redistribution substrate on the first molding layer. The second semiconductor package may include: a package substrate on the second redistribution substrate; a second semiconductor chip on the package substrate; and a second molding layer at least partially covering the package substrate and the second semiconductor chip. A thickness of the first passivation layer may be less than a thickness of the second passivation layer. The first passivation layer and the second passivation layer may include different materials from each other.

BRIEF DESCRIPTION OF THE DRAWINGS

FIGS. 2 to 8 illustrate cross-sectional views showing a method of fabricating a semiconductor package according to some embodiments of the present inventive concepts.

DETAILED DESCRIPTION

Some embodiments of the present inventive concepts will now be described in detail with reference to the accompanying drawings to aid in clearly explaining the present inventive concepts.

Figure 1A:
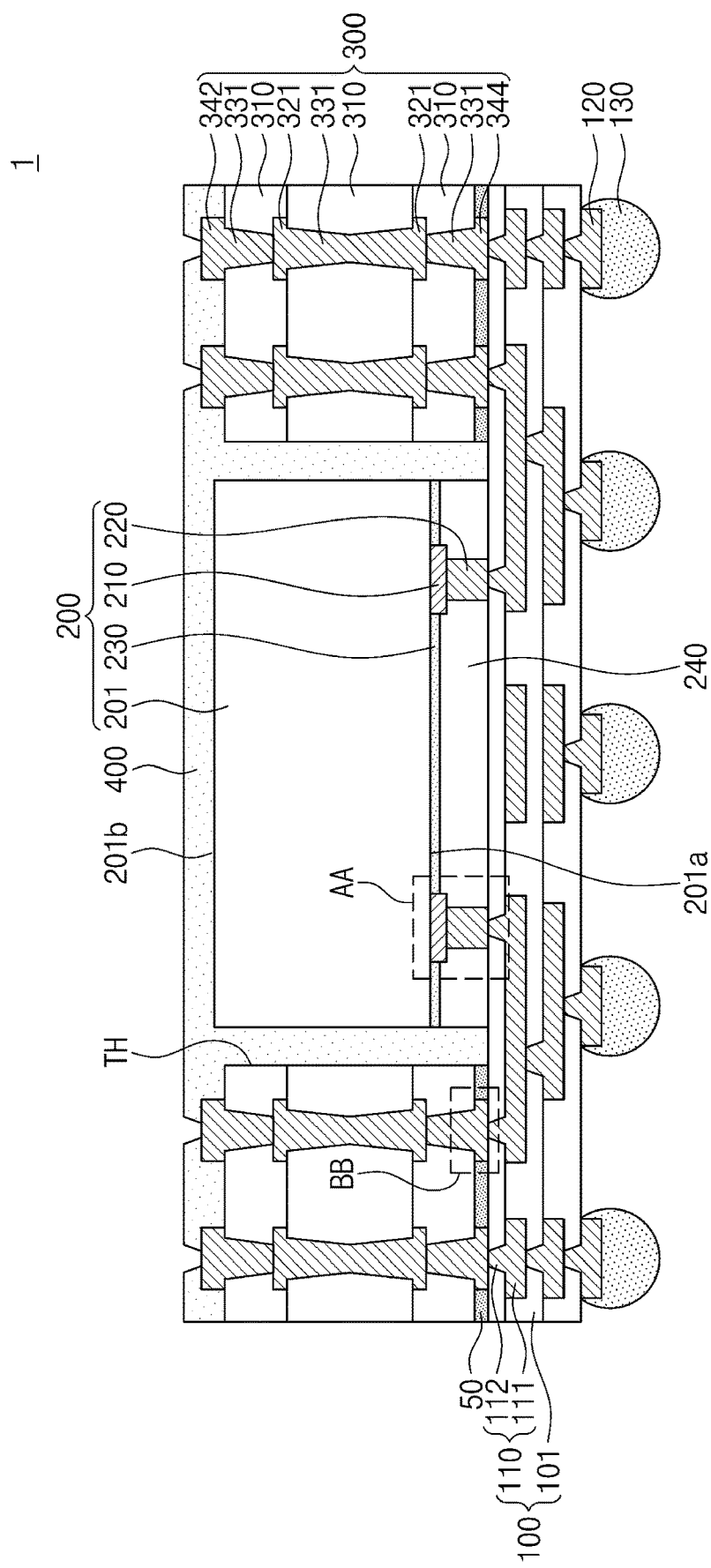
FIG. 1A illustrates a cross-sectional view showing a semiconductor package according to some embodiments of the present inventive concepts.
Figure 1B:
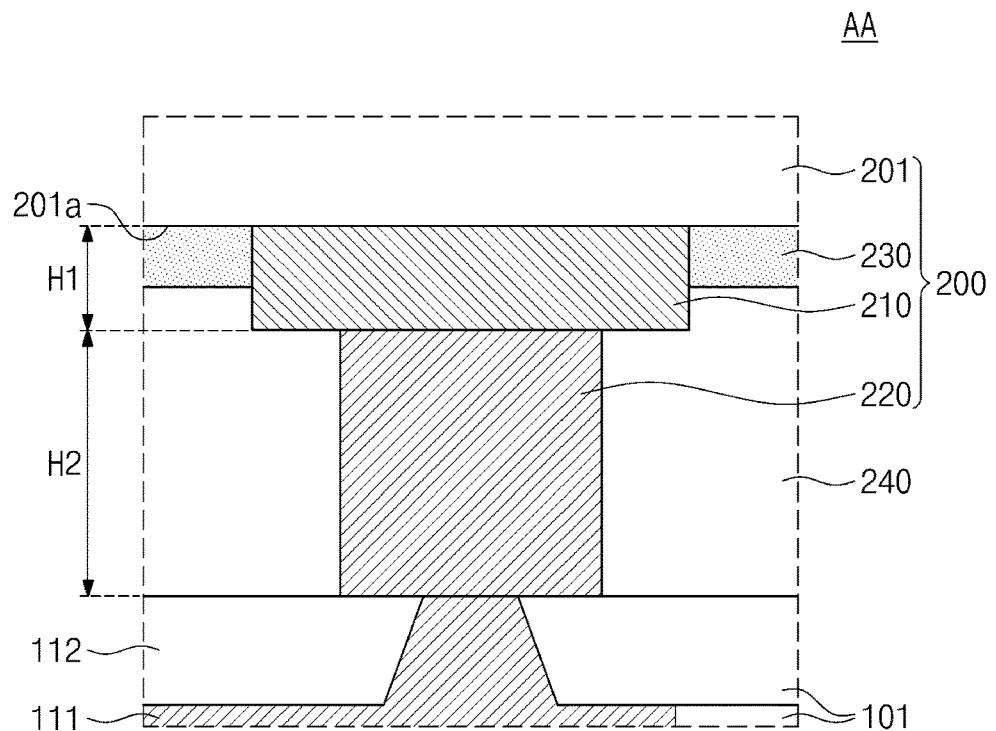
FIG. 1B illustrates an enlarged cross-sectional view of section AA depicted in FIG. 1A, partially showing a semiconductor package according to some embodiments of the present inventive concepts.
Figure 1C:
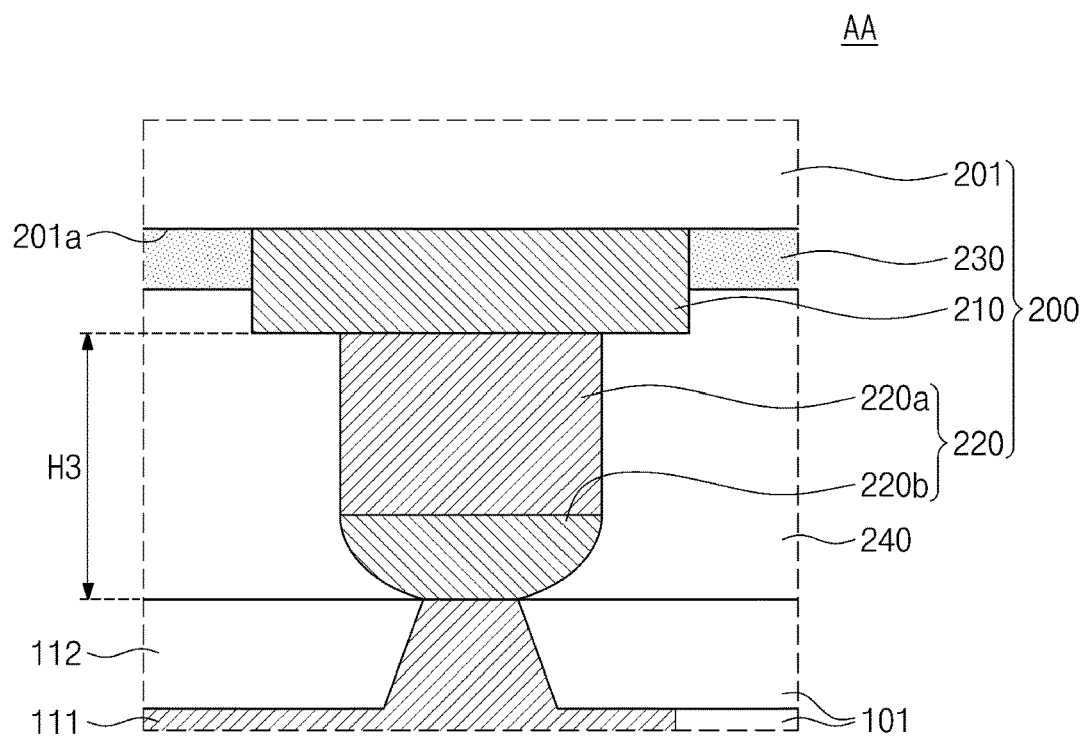
FIG. 1C illustrates an enlarged cross-sectional view of section AA depicted in FIG. 1A, partially showing a semiconductor package according to some embodiments of the present inventive concepts.
Figure 1D:
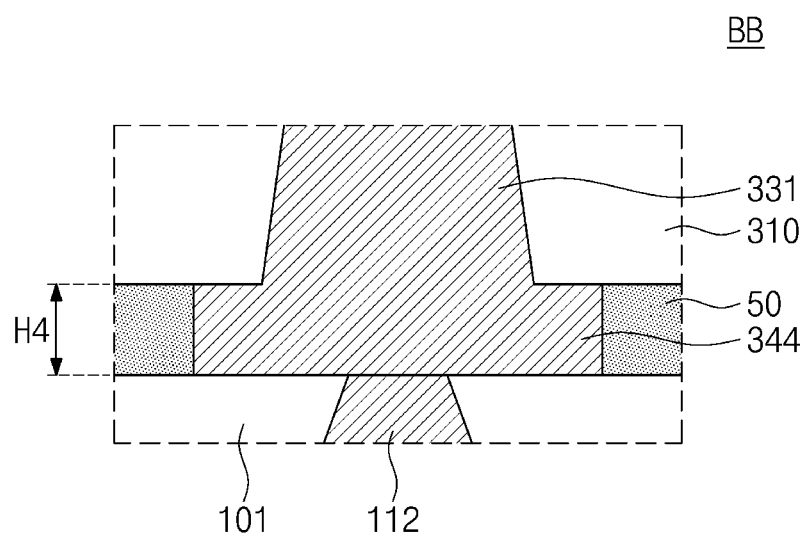
FIG. 1D illustrates an enlarged cross-sectional view of section BB depicted in FIG. 1A, partially showing a semiconductor package according to some embodiments of the present inventive concepts.

FIG. 1A illustrates a cross-sectional view showing a semiconductor package according to some embodiments of the present inventive concepts. FIG. 1B illustrates an enlarged cross-sectional view of section AA depicted in FIG. 1A, partially showing a semiconductor package according to some embodiments of the present inventive concepts. FIG. 1C illustrates an enlarged cross-sectional view of section AA depicted in FIG. 1A, partially showing a semiconductor package according to some embodiments of the present inventive concepts. FIG. 1D illustrates an enlarged cross-sectional view of section BB depicted in FIG. 1A, partially showing a semiconductor package according to some embodiments of the present inventive concepts.

Referring to FIGS. 1A and 1B, a semiconductor package 1 may include a first redistribution substrate 100, a first semiconductor chip 200, a second passivation layer 240, a connection substrate 300, a dielectric layer 50, a first molding layer 400, and an external connection terminal 130.

The first redistribution substrate 100 may include first redistribution dielectric layers 101 and first redistribution patterns 110 interposed between the first redistribution dielectric layers 101. The first redistribution substrate 100 may further include under-bump patterns 120 in a lower portion thereof.

The first redistribution dielectric layers 101 may be stacked one atop another. FIG. 1A depicts three first redistribution dielectric layers 101, but the first redistribution dielectric layers 101 may be added or omitted. No interface may appear between the first redistribution dielectric layers 101. For example, the first redistribution dielectric layers 101 may be observed as one dielectric layer. The first redistribution dielectric layers 101 may include, for example, a photo-imagable dielectric (PID) material. The photo-imagable dielectric material may include at least one selected from photosensitive polyimide, polybenzoxazole, phenolic polymers, and benzocyclobutene polymers.

Each of the first redistribution patterns 110 may include a first wire portion 111 and a first via portion 112 that are connected into a single unitary body. The first wire portion 111 may be provided below and connected to the first via portion 112. The first via portion 112 may be a part that protrudes from the first wire portion 111 toward a top surface of the first redistribution substrate 100. The first wire portion 111 and the first via portion 112 may include the same material, for example, copper (Cu).

The under-bump patterns 120 may be disposed in openings of a lowermost one of the first redistribution dielectric layers 101 and may be electrically connected to the first redistribution patterns 110. The under-bump patterns 120 may be outwardly exposed while extending onto a bottom surface of the lowermost one of the first redistribution dielectric layers 101. The under-bump patterns 120 may include, for example, copper.

The first semiconductor chip 200 may be provided on the first redistribution substrate 100. The first semiconductor chip 200 may be, for example, a logic chip or a memory chip. The first semiconductor chip 200 may include a first body 201, a first chip pad 210, a pillar 220, and a first passivation layer 230.

The first body 201 may have a first surface 201a adjacent to the first redistribution substrate 100 and an opposite second surface 201b. The first surface 201a may be an active surface of the first semiconductor chip 200. The second surface 201b may be an inactive surface of the first semiconductor chip 200. The first surface 201a may be directed toward or face the first redistribution substrate 100. The first body 201 may include, for example, silicon (Si), germanium (Ge), or gallium-arsenic (GaAs).

The first chip pad 210 may be provided on the first surface 201a of the first body 201. The first chip pad 210 may protrude onto or from the first surface 201a of the first body 201. The first chip pad 210 may have a first thickness H1. The first thickness H1 may range, for example, from about 1 μm to about 4 μm. The first chip pad 210 may include a metallic material, such as aluminum (Al).

The pillar 220 may be provided on the bottom surface of the first chip pad 210. The pillar 220 may be connected to the first chip pad 210. The pillar 220 may have a width less than that of the first chip pad 210. Referring to FIG. 1B, the pillar 220 may have a second thickness H2. The second thickness H2 may range, for example, from about 3 μm to about 40 μm. A bottom surface of the pillar 220 may be in contact with an uppermost one of the first redistribution patterns 110. The pillar 220 may be electrically connected to the first chip pad 210 and the first redistribution patterns 110. The first semiconductor chip 200 may be electrically connected to the first redistribution substrate 100. The pillar 220 may include, for example, at least one selected from copper (Cu), tin (Sn), and an alloy that includes tin.

Referring to FIGS. 1A and 1C, for example, the pillar 220 may include a pillar portion 220a and a solder 220b. The pillar portion 220a may be provided on the bottom surface of the first chip pad 210. The pillar portion 220a may be connected to the first chip pad 210. The pillar portion 220a may have a width less than that of the first chip pad 210. The pillar portion 220a may include at least one selected from copper, tin, and an alloy that includes tin. The solder 220b may be provided on a bottom surface of the pillar portion 220a. The solder 220b may be connected to the pillar portion 220a. The solder 220b may have, for example, a hemispherical or oval shape. A maximum width of the solder 220b may be less than the width of the first chip pad 210. The maximum width of the solder 220b may be the same as the width of the pillar portion 220a. A lowermost surface of the solder 220b may be in contact with the uppermost one of the first redistribution patterns 110. A third thickness H3 may be defined to refer to a sum of thicknesses of the pillar portion 220a and the solder 220b. The third thickness H3 may substantially be a thickness of the pillar 220. The third thickness H3 may range, for example, from about 3 μm to about 40 μm.

Referring back to FIGS. 1A and 1B, the first passivation layer 230 may be provided on the first surface 201a of the first body 201. The first passivation layer 230 may at least partially cover a lateral or side surface of the first chip pad 210. A bottom surface of the first passivation layer 230 may be at a vertical level the same as or higher than that of the bottom surface of the first chip pad 210. The first passivation layer 230 may be an oxide layer, a nitride layer, or a double layer of oxide and nitride layers.

The second passivation layer 240 may be provided between the first body 201 and the first redistribution substrate 100. The first passivation layer 230 may be interposed between the first body 201 and the second passivation layer 240. The second passivation layer 240 may cover a lateral or side surface of the pillar 220. For example, the second passivation layer 240 may cover a portion of a bottom surface of the first chip pad 210 and at least a portion of the lateral or side surface of the first chip pad 210. A top surface of the second passivation layer 240 may be located at a vertical level the same as or higher than that of the bottom surface of the first chip pad 210. A bottom surface of the second passivation layer 240 may be coplanar with that of the pillar 220. The bottom surface of the second passivation layer 240 may be in contact with the first redistribution substrate 100. The second passivation layer 240 may have a thickness greater than the second thickness H2, or may have a thickness the same as the thickness of the pillar 220. For example, the thickness of the second passivation layer 240 may be the same as the second thickness H2. The thickness of the second passivation layer 240 may be greater than that of the first passivation layer 230.

The second passivation layer 240 may include a different material from that of the first passivation layer 230. The second passivation layer 240 may be a cured resin. For example, the second passivation layer 240 may include an under-fill material. The under-fill material may include, for example, at least one selected from a non-conductive film (NCF), a non-conductive paste (NCP), a B-stage under-fill, a capillary under-fill, a fluxing under-fill, and a hybrid under-fill.

The first semiconductor chip 200 may be surrounded by the connection substrate 300 including a through hole TH. The first semiconductor chip 200 may be disposed in the through hole TH of the connection substrate 300. The first semiconductor chip 200 may be spaced apart from the connection substrate 300. The connection substrate 300 may include base layers 310, wire patterns 321, vias 331, upper pads 342, and lower pads 344.

The base layers 310 may include a dielectric material. The dielectric material may include a thermosetting resin such as epoxy resin, a thermoplastic resin such as polyimide, or a resin such as prepreg, Ajinomoto build-up film (ABF), flame-retardant 4 (FR4), or bismaleimide triazine (BT), in which a thermosetting or thermoplastic resin is impregnated into a core material such as inorganic filler or glass fiber (or glass cloth, glass fabric, etc.).

The wire patterns 321 may be interposed between the base layers 310. The wire patterns 321 may serve to redistribute the first chip pad 210 of the first semiconductor chip 200. The wire patterns 321 may include a conductive material, such as copper (Cu), aluminum (Al), silver (Ag), tin (Sn), gold (Au), nickel (Ni), lead (Pb), titanium (Ti), or any alloy thereof.

The vias 331 may penetrate at least one of the base layers 310. The vias 331 may be correspondingly connected to the wire patterns 321. The vias 331 may electrically connect to each other the wire patterns 321 formed at different levels. The vias 331 may have, for example, a tapered shape. The vias 331 may include a conductive material, such as copper (Cu), aluminum (Al), silver (Ag), tin (Sn), gold (Au), nickel (Ni), lead (Pb), titanium (Ti), or any alloy thereof.

The upper pads 342 may be provided on a top surface of an uppermost one of the base layers 310. The upper pads 342 may be outwardly protrude from the base layers 310. The upper pad 342 and the via 331 may be formed into a single unitary body. The upper pads 342 may include a conductive material, such as copper (Cu), aluminum (Al), silver (Ag), tin (Sn), gold (Au), nickel (Ni), lead (Pb), titanium (Ti), or any alloy thereof.

Referring to FIGS. 1A and 1D, the lower pads 344 may be provided on a bottom surface of a lowermost one of the base layers 310. The lower pads 344 may outwardly protrude from the base layers 310. The lower pads 341 may be connected to the vias 331. The lower pads 344 may have their bottom surfaces in contact with the uppermost ones of the first redistribution patterns 110. The lower pads 344 may be electrically connected to the vias 331 and the first redistribution patterns 110. The connection substrate 300 may be electrically connected through the lower pads 344 to the first redistribution substrate 100. The connection substrate 300 may be electrically connected through the first redistribution substrate 100 to the first semiconductor chip 200. Each of the lower pads 344 may have a fourth thickness H4. The fourth thickness H4 may range, for example, from about 3 μm to about 10 μm. For example, the bottom surfaces of the lower pads 344 may protrude a thickness of about 3 μm to about 10 μm from the bottom surface of the lowermost one of the base layers 310.

The lower pad 344 and its corresponding via 331 may be formed into a single unitary body. The lower pads 344 may include a conductive material, such as copper (Cu), aluminum (Al), silver (Ag), tin (Sn), gold (Au), nickel (Ni), lead (Pb), titanium (Ti), or any alloy thereof.

The dielectric layer 50 may be provided on the bottom surface of the lowermost one of the base layers 310. The dielectric layer 50 may cover at least a portion of lateral or side surfaces of the lower pads 344. For example, the dielectric layer 50 may cover the entireties of the lateral surfaces of the lower pads 344. A top surface of the dielectric layer 50 may at least partially cover the bottom surface of the lowermost one of the base layers 310. A bottom surface of the dielectric layer 50 may at least partially cover the top surface of the first redistribution substrate 100. The dielectric layer 50 may be provided only between the first redistribution substrate 100 and the lowermost one of the base layers 310. The dielectric layer 50 may have a thickness substantially the same as that of each of the lower pads 344. The dielectric layer 50 may include a dielectric material different from that of the second passivation layer 240. The dielectric layer 150 may include a photo-imagable dielectric (PID) material. The photo-imagable dielectric material may include at least one selected from photosensitive polyimide, polybenzoxazole, phenolic polymers, and benzocyclobutene polymers.

Referring back to FIG. 1A, the first molding layer 400 may cover the connection substrate 300, the first semiconductor chip 200, and the first redistribution substrate 100. The first molding layer 400 may at least partially cover the top surface of the uppermost one of the base layers 310 included in the connection substrate 300. The first molding layer 400 may cover the upper pads 342 of the connection substrate 300. The first molding layer 400 may partially expose top surfaces of the upper pads 342. The first molding layer 400 may cover the second surface 201b of the first body 201. The first molding layer 400 may fill a space between a lateral or side surface of the first semiconductor chip 200 and a wall surface or side surface of the through hole TH of the connection substrate 300. The first molding layer 400 may fill a space between the second passivation layer 240 and the connection substrate 300 and a space between the second passivation layer 240 and the dielectric layer 50. The first molding layer 400 may cover a lateral or side surface of the connection substrate 300 and the lateral or side surface of the first semiconductor chip 200. The first molding layer 400 may cover lateral or side surfaces of the first and second passivation layers 230 and 240. The first molding layer 400 may cover one lateral or side surface of the dielectric layer 50. The first molding layer 400 may not be interposed between the first semiconductor chip 200 and the first redistribution substrate 100.

The first molding layer 400 may include a thermosetting resin such as epoxy resin, a thermoplastic resin such as polyimide, or a resin such as prepreg, Ajinomoto build-up film (ABF), flame-retardant 4 (FR4), or bismaleimide triazine (BT), in which a thermosetting or thermoplastic resin is impregnated into a core material such as inorganic filler or glass fiber (or glass cloth, glass fabric, etc.).

The external connection terminal 130 may be provided below the under-bump pattern 120. The external connection terminal 130 may be connected to the under-bump pattern 120. The external connection terminal 130 may be electrically connected through the under-bump patterns 120 to the first redistribution substrate 100. For example, the external connection terminal 130 may be one of lands, balls, and pins. The external connection terminal 130 may be formed as a multiple or single layer. The external connection terminal 130 may include a conductive material. The external connection terminal 130 may include, for example, solder.

FIGS. 2 to 8 illustrate cross-sectional views showing a method of fabricating a semiconductor package according to some embodiments of the present inventive concepts.

Referring to FIG. 2, there may be provided a wafer WF on which an integrated circuit is formed and a second preliminary passivation layer 240a on the wafer WF.

The wafer WF may include a preliminary body 202, a first chip pad 210, a pillar 220, a first preliminary passivation layer 230a, and metal circuit patterns 270. The preliminary body 202 may include a chip region CA and a TEG region TEG. The first chip pad 210 and the pillar 220 may be provided on the chip region CA of the preliminary body 202. The metal circuit patterns 270 may be provided on the TEG region TEG of the preliminary body 202. The metal circuit patterns 270 may include a metallic material. The first preliminary passivation layer 230a may be provided on the chip region CA and the TEG region TEG of the preliminary body 202.

When a sawing process SAW is performed as discussed below, the chip region CA of the wafer WF may be a zone which will be formed into a first semiconductor chip 200. The TEG region TEG of the wafer WF may be a zone on which an electrical test can be performed. The TEG region TEG may be the same as a zone on which a sawing process SAW will be subsequently performed.

The second preliminary passivation layer 240a may be formed on one surface of the wafer WF. The one surface of the wafer WF may be a first surface 201a of a first body 201 which will be formed below. For example, the one surface of the wafer WF may be an active surface of the first semiconductor chip 200. The second preliminary passivation layer 240a may cover the pillar 220. The second preliminary passivation layer 240a may cover lateral and top surfaces of the pillar 220. The second preliminary passivation layer 240a may be formed by a lamination process or a spray process. The second preliminary passivation layer 240a may include the same material as that of a second passivation layer 240 which will be discussed below. The second preliminary passivation layer 240a may be formed by coating and curing an under-fill material. The under-fill material may include, for example, at least one selected from a non-conductive film (NCF), a non-conductive paste (NCP), a B-stage under-fill, a capillary under-fill, a fluxing under-fill, and a hybrid under-fill.

A back grinding process BG may be performed on another surface of the wafer WF. As the second preliminary passivation layer 240a is formed on the one surface of the wafer WF, the back grinding process BG may be executed without using a protection tape. Therefore, a simplified process may be achieved.

Figure 3:
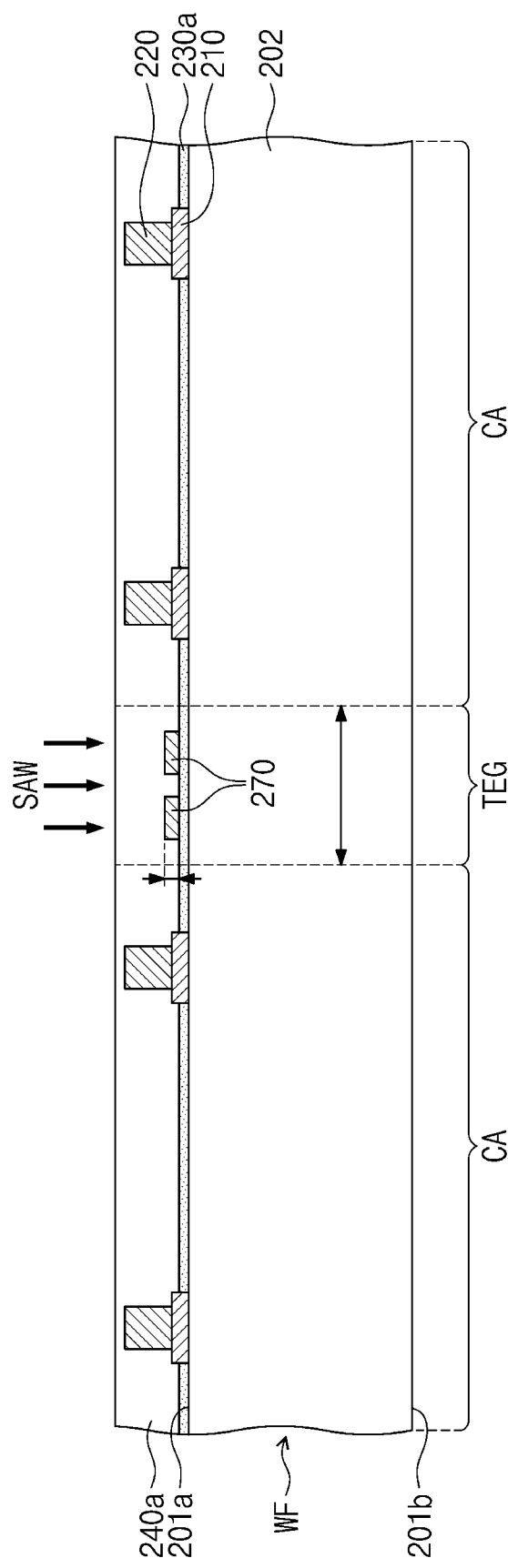
Figure 4:
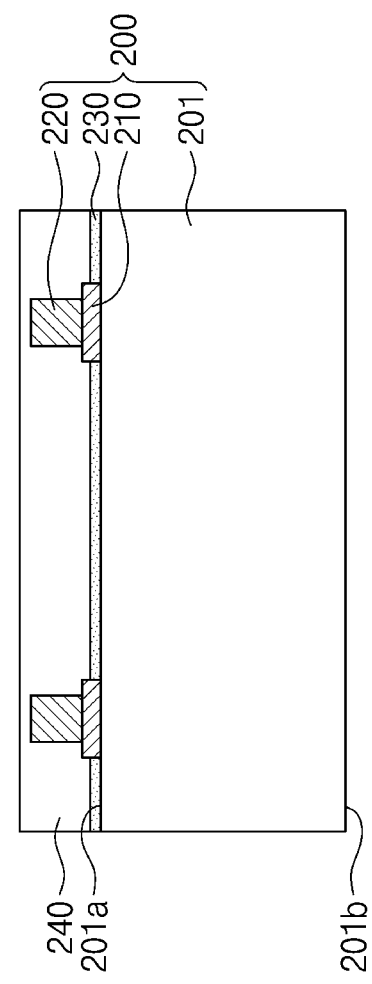

Referring to FIGS. 3 and 4, a first semiconductor chip 200 may be fabricated by performing a sawing process SAW on the wafer WF that has undergone the back grinding process BG. The sawing process SAW may be executed on the TEG region TEG. After the sawing process SAW is performed, the first preliminary passivation layer 230a may be converted into a first passivation layer 230, and the second preliminary passivation layer 240a may be converted into a second passivation layer 240. The TEG region TEG may be removed while the sawing process SAW is performed.

In the present inventive concepts, the presence of the second passivation layer 240 may prevent a burr phenomenon that the metal circuit patterns 270 on the TEG region TEG protrude while the sawing process SAW is performed. It may therefore be possible to prevent damage to a first redistribution substrate 100 which will be manufactured, and thus a semiconductor package (see 1 of FIG. 1A) may increase in reliability.

Figure 5:
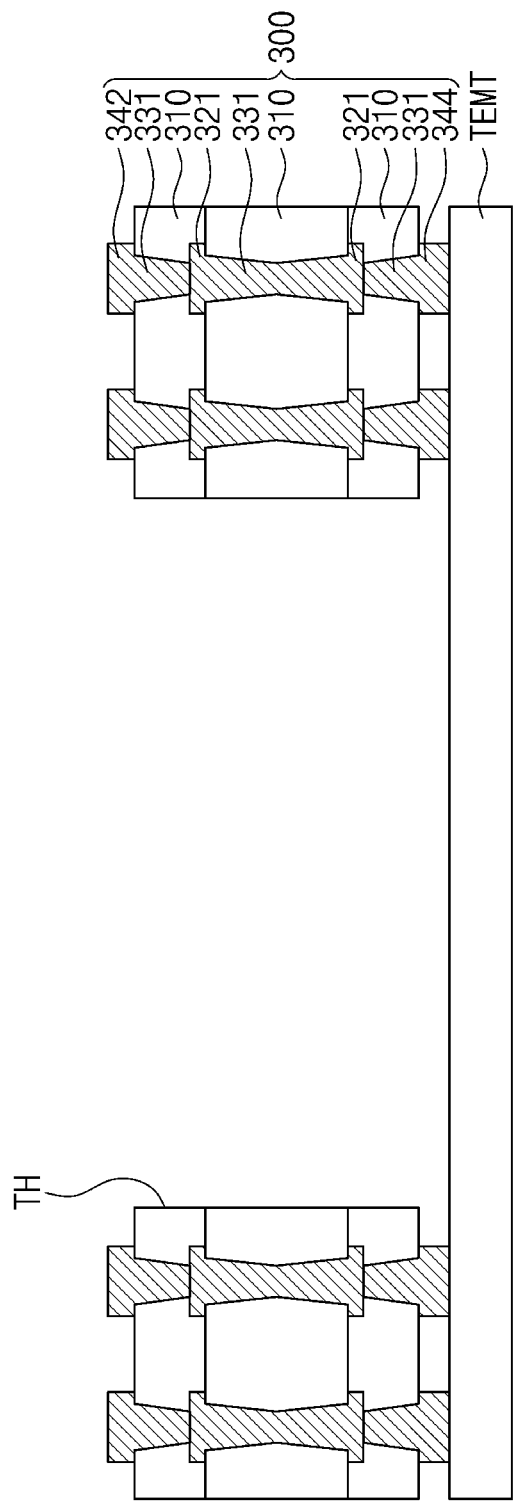

Referring to FIG. 5, a connection substrate 300 may be provided which includes a through hole TH on a temporary film TEMT. The temporary film TEMT may include, for example, a polyimide tape. The connection substrate 300 may include base layers 310, wire patterns 321, vias 331, upper pads 342, and lower pads 344. The upper pads 342 and the lower pads 344 may protrude from a surface of the connection substrate 300. The lower pads 344 may have their bottom surfaces in contact with a top surface of the temporary film TEMT.

Figure 6:
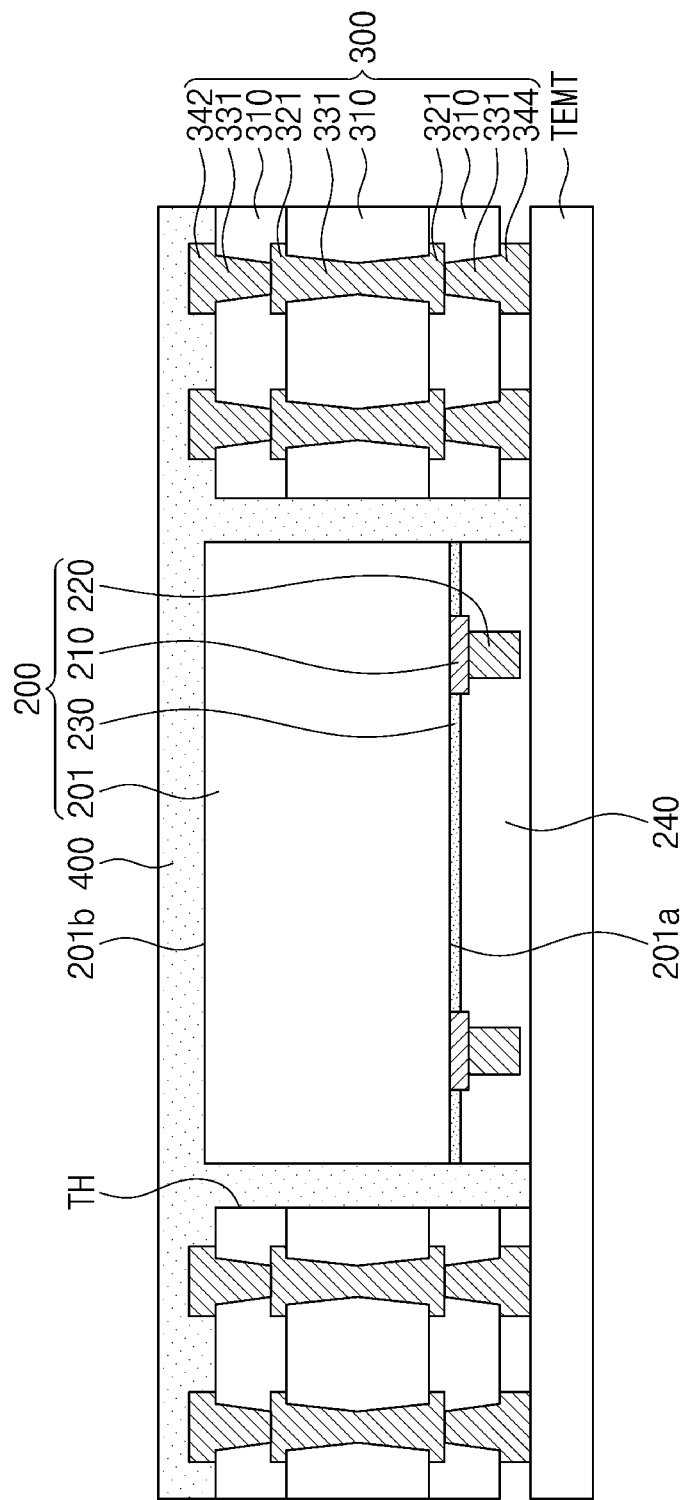

Referring to FIG. 6, a first semiconductor chip 200 may be disposed in the through hole TH of the connection substrate 300 and on the temporary film TEMT. The first semiconductor chip 200 may be disposed to allow the first surface 201a of the first body 201 to face toward the top surface of the temporary film TEMT. The second passivation layer 240 may have a bottom surface in contact with the top surface of the temporary film TEMT.

Afterwards, a first molding layer 400 may be formed to cover the first semiconductor chip 200 and the connection substrate 300. The first molding layer 400 may cover a top surface of an uppermost one of the base layers 310 included in the connection substrate 300. The first molding layer 400 may cover a lateral surface of the connection substrate 300. The first molding layer 400 may cover the upper pads 342 of the connection substrate 300. The first molding layer 400 may cover a second surface 201b and a lateral surface of the first body 201. The first molding layer 400 may cover lateral surfaces of the first and second passivation layers 230 and 240. The first molding layer 400 may fill a space between the first semiconductor chip 200 and the connection substrate 300, a space between the second passivation layer 240 and the connection substrate 300, and a space between the second passivation layer 240 and the dielectric layer 50. The first molding layer 400 may not fill an area below the first semiconductor chip 200. The first molding layer 400 may not be interposed between the connection substrate 300 and the temporary film TEMT. The first molding layer 400 may not cover lateral surfaces of the lower pads 344. For example, a precursor may be laminated and then cured to form the first molding layer 400.

When a molding layer enters below a semiconductor chip to fill a space between bumps of the semiconductor chips, in a subsequent process, a delamination phenomenon may occur due to a difference in thermal expansion efficient between the molding layer, the semiconductor chip, and the bump. The delamination phenomenon may interrupt bond of a redistribution substrate in a subsequent redistribution process. In the present inventive concepts, the second passivation layer 240 covers the pillar 220, and thus the first molding layer 400 may not enter below the first semiconductor chip 200. Therefore, the delamination phenomenon may be prevented to increase reliability of a semiconductor package (see 1 of FIG. 1A).

Figure 7:
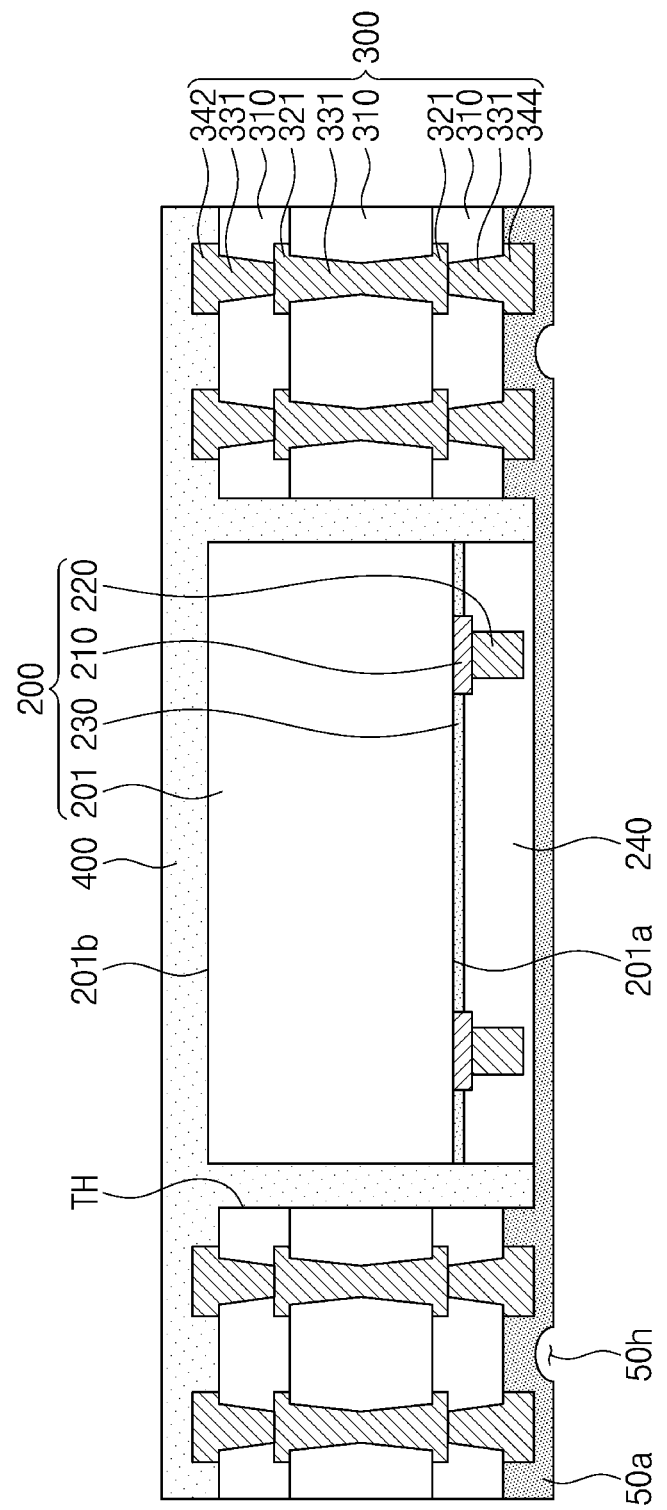

Referring to FIG. 7, the temporary film TEMT may be removed, and a dielectric layer 50a may be formed. The dielectric layer 50a may cover a bottom surface of the second passivation layer 240, a bottom surface of the first molding layer 400, a bottom surface of the connection substrate 300, and bottom and lateral surfaces of the lower pads 344. The dielectric layer 50a may include the same material as that of a dielectric layer 50 which will be discussed below. The dielectric layer 50a may be formed by a coating process, such as spin coating or slit coating.

As the lower pads 344 protrude from the connection substrate 300, a recess 50h may be created on the dielectric layer 50a. The dielectric layer 50a may have a step difference caused by the recess 50h, and thus it may be difficult to achieve a fine pattern in a subsequent redistribution process.

Figure 8:
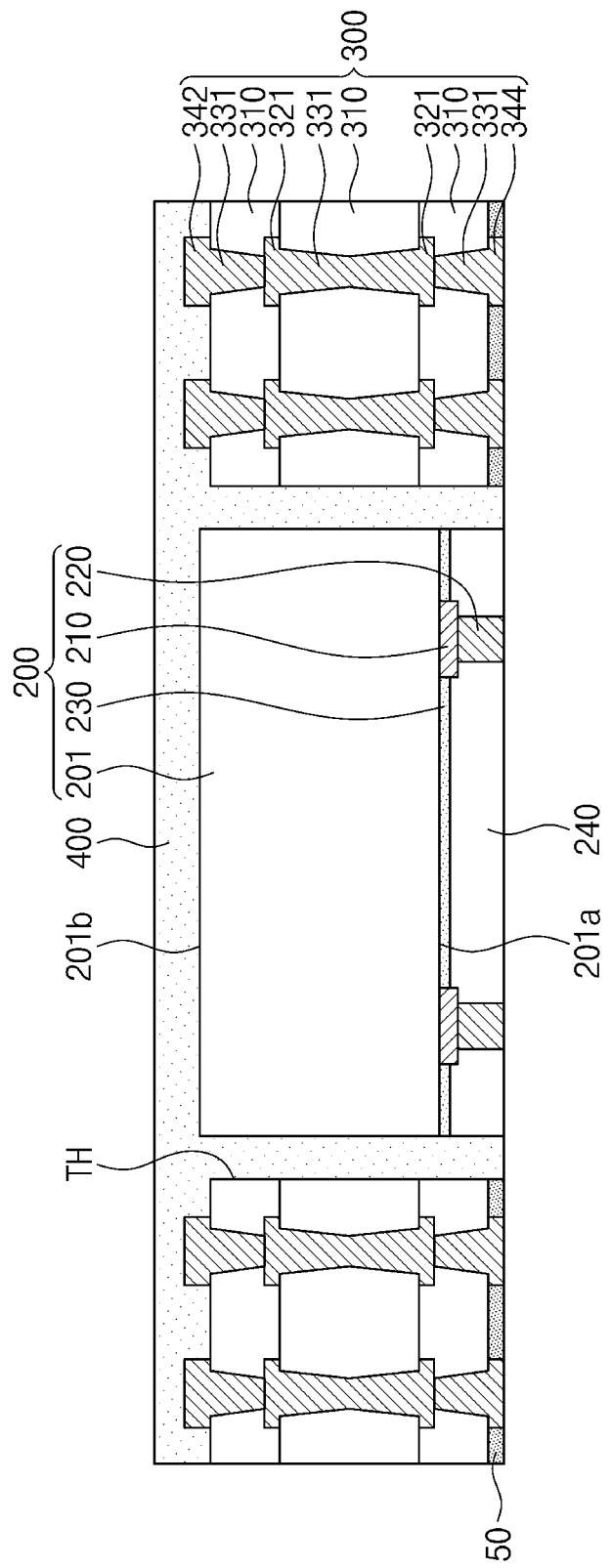

Referring to FIG. 8, a surface planarization may be performed on the dielectric layer 50a. The surface planarization may continue until exposure of a bottom surface of the pillar 220 and bottom surfaces of the lower pads 344. For example, the surface planarization may remove a portion of the dielectric layer 50a, a portion of the pillar 220, a portion of the second passivation layer 240, a portion of the first molding layer 400, and portions of the lower pads 344. After the surface planarization is performed, the dielectric layer 50a may be converted into a dielectric layer 50. The surface planarization may remove the recess 50h of the dielectric layer 50a. After the surface planarization is performed, the dielectric layer 50 may remain only below a lowermost one of the base layers 310 included in the connection substrate 300. After the surface planarization is performed, the pillar 220, the second passivation layer 240, the first molding layer 400, the lower pads 344, and the dielectric layer 50 may have their bottom surfaces that are coplanar with each other. A diamond bite or bit may be used to perform the surface planarization.

A fine pattern is ceaselessly required for recently developing premium application processors or flip chip based devices. Thus it may be considered to adopt copper pillar structures as final pad metals on bonding pads. However, when a redistribution process is performed after a chip placement process, a step difference due to the copper pillar may induce difficulty in achieving fine patterns in redistribution formation. In the present inventive concepts, the second passivation layer 240 may eliminate the step difference caused by the pillar 220, and the surface planarization may remove the recess 50h present in the dielectric layer 50a. Accordingly, it may be possible to easily and efficiently form fine patterns of a redistribution substrate.

There may be a reduction in the number of process steps for forming a panel having pads that protrude onto opposite sides thereof, as compared to process steps for forming a panel having embedded pads. According to the present inventive concepts, even when the protruding lower pads 344 cause to create the recess 50h on the dielectric layer 50a, the surface planarization may be performed to remove the recess 50h. Therefore, it may be possible to use the connection substrate 300 including the upper and lower pads 342 and 344 that protrude from surfaces thereof, which may result in a reduction in manufacturing cost.

Referring back to FIG. 1A, a first redistribution substrate 100 may be formed below the first semiconductor chip 200, the connection substrate 300, and the first molding layer 400. The first redistribution substrate 100 may include first redistribution dielectric layers 101 and first redistribution patterns 110 interposed between the first redistribution dielectric layers 101. The first redistribution dielectric layer 101 may be formed by a coating process, such as spin coating or slit coating. The first redistribution dielectric layers 101 may undergo exposure and development processes to form via holes. A first via portion 112 may be formed in the via hole. A first wire portion 111 may be formed on a bottom surface of the first redistribution dielectric layer 101. The first redistribution patterns 110 may be formed by performing an electroplating process such as plating or pulse plating. The first wire portion 111 and the first via portion 112 may be integrally connected to constitute the first redistribution pattern 110.

Under-bump patterns 120 may be formed below the first redistribution substrate 100. An electroplating process may be employed to form the under-bump patterns 120.

The first molding layer 400 may undergo exposure, development, and dry etching processes to partially expose top surfaces of the upper pads 342. A semiconductor package 1 may thus be fabricated.

Figure 9A:
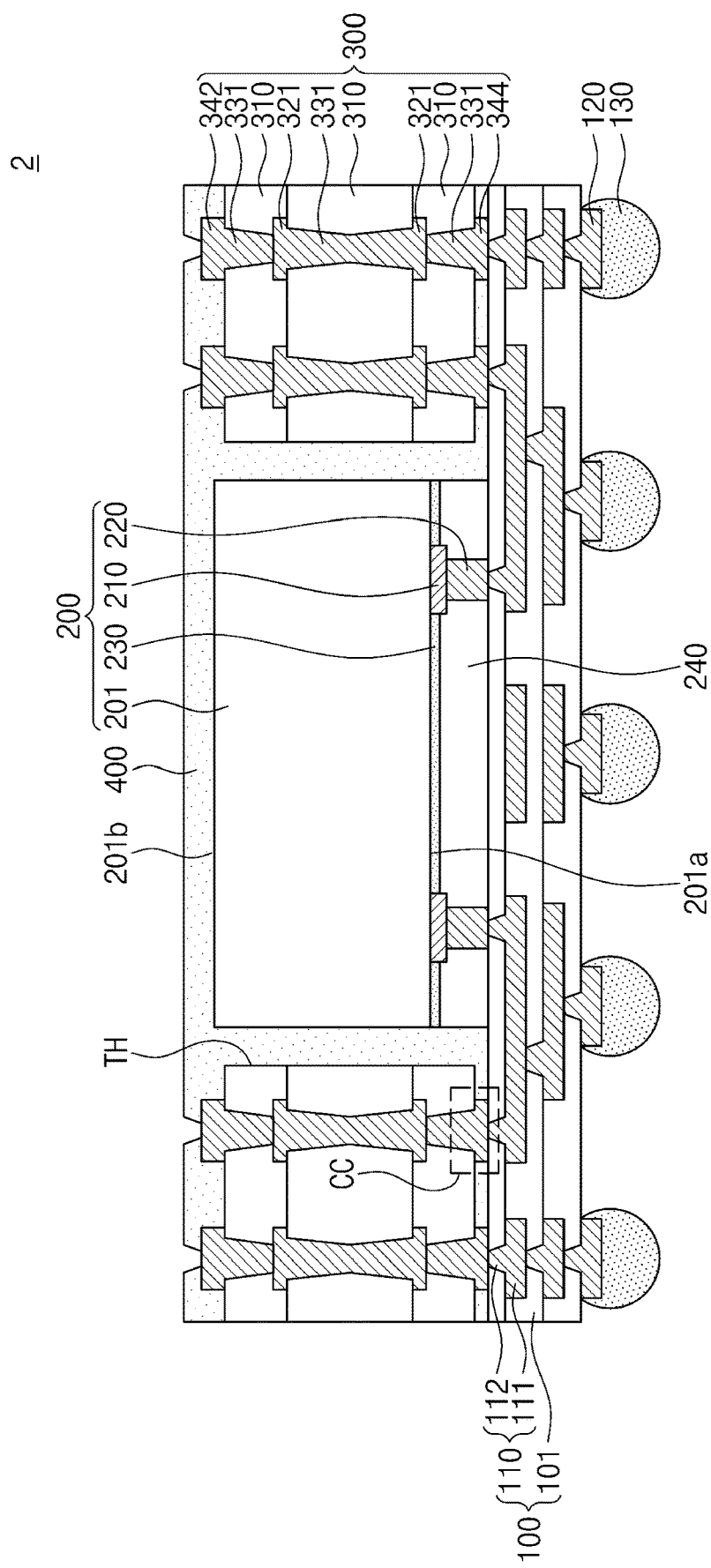
FIG. 9A illustrates a cross-sectional view showing a semiconductor package according to some embodiments of the present inventive concepts.
Figure 9B:
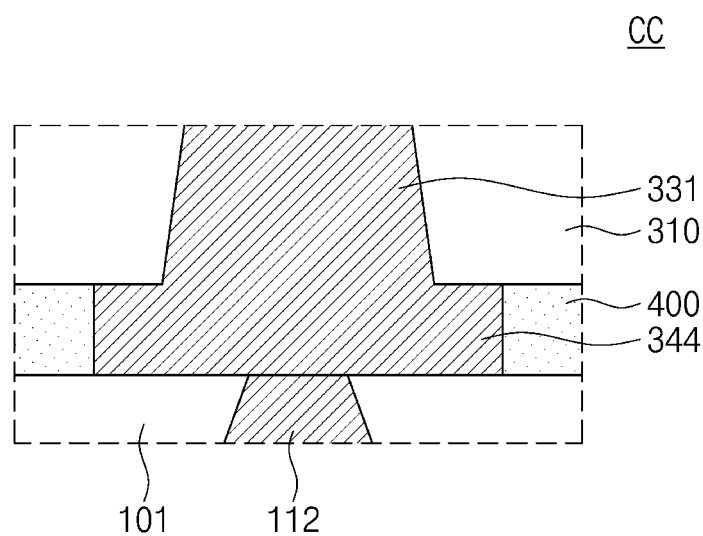
FIG. 9B illustrates an enlarged cross-sectional view of section CC depicted in FIG. 9A, partially showing a semiconductor package according to some embodiments of the present inventive concepts.

FIG. 9A illustrates a cross-sectional view showing a semiconductor package according to some embodiments of the present inventive concepts. FIG. 9B illustrates an enlarged cross-sectional view of section CC depicted in FIG. 9A, partially showing a semiconductor package according to some embodiments of the present inventive concepts. Except the following description, in the interest of brevity, omission will be made to avoid repetitive explanations of components mentioned with reference to FIGS. 1A to 1D.

Referring to FIGS. 9A and 9B, a semiconductor package 2 may include a first redistribution substrate 100, a first semiconductor chip 200, a second passivation layer 240, a connection substrate 300, a first molding layer 400, and an external connection terminal 130.

The first redistribution substrate 100 may include first redistribution dielectric layers 101 and first redistribution patterns 110 interposed between the first redistribution dielectric layers 101. The first redistribution substrate 100 may further include under-bump patterns 120 in a lower portion thereof.

The first semiconductor chip 200 may be provided on the first redistribution substrate 100. The first semiconductor chip 200 may include a first body 201, a first chip pad 210, a pillar 220, and a first passivation layer 230.

The second passivation layer 240 may be provided between the first body 201 and the first redistribution substrate 100. The second passivation layer 240 may cover a lateral surface of the pillar 220.

The first semiconductor chip 200 may be surrounded by the connection substrate 300 including a through hole TH. The first semiconductor chip 200 may be disposed in the through hole TH of the connection substrate 300. The first semiconductor chip 200 may be spaced apart from the connection substrate 300. The connection substrate 300 may include base layers 310, wire patterns 321, vias 331, upper pads 342, and lower pads 344.

The first molding layer 400 may cover the connection substrate 300, the first semiconductor chip 200, and the first redistribution substrate 100. The first molding layer 400 may fill a space between a lateral surface of the first semiconductor chip 200 and a wall surface of the through hole TH of the connection substrate 300. The first molding layer 400 may extend between a top surface of the first redistribution substrate 100 and a bottom surface of the connection substrate 300, thereby covering lateral surfaces of the lower pads 344. In this case, the dielectric layer 50 of FIG. 1A may be omitted. The first molding layer 400 may cover the bottom surface of the connection substrate 300.

Figure 10:
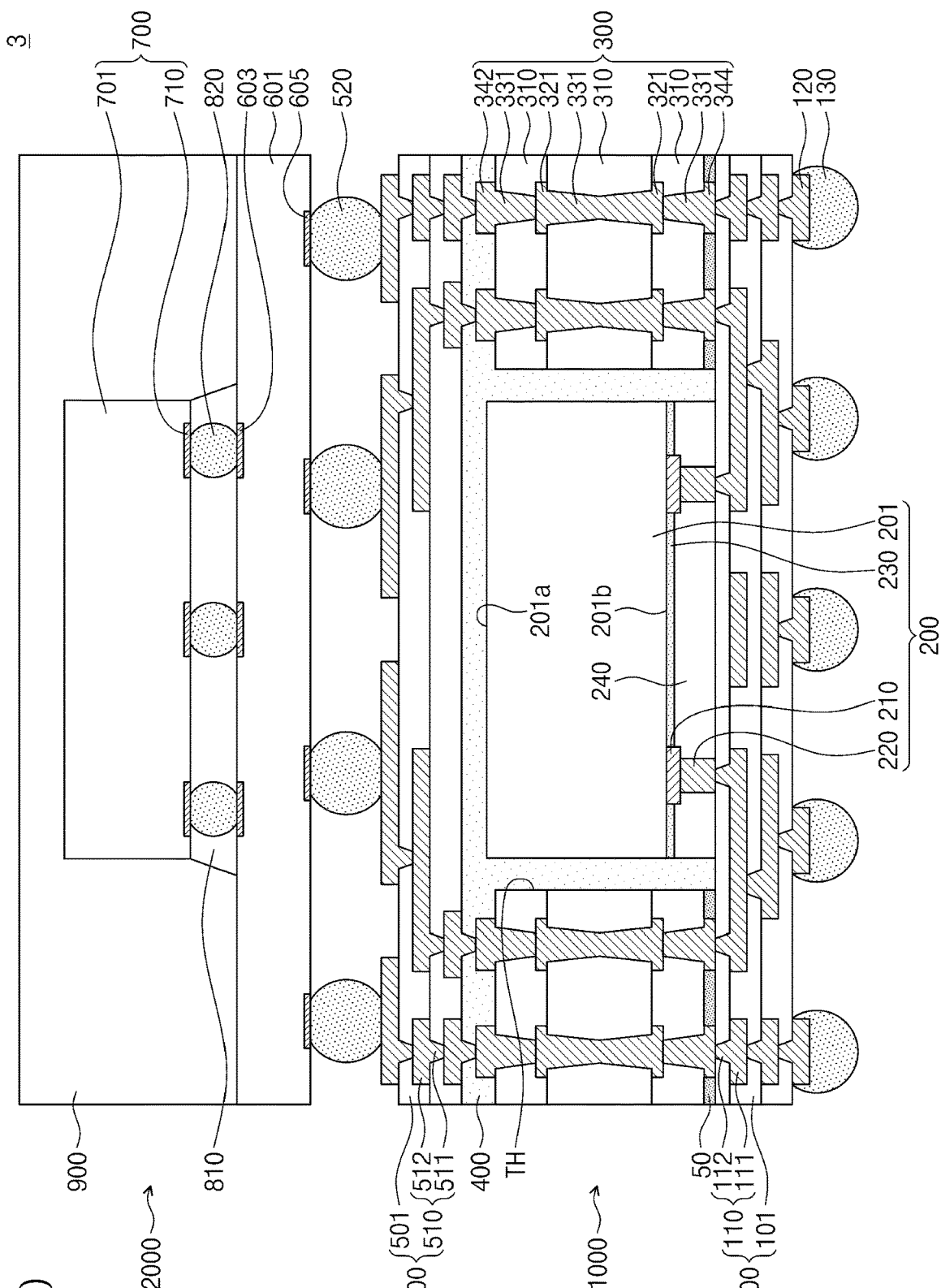
FIG. 10 illustrates a cross-sectional view showing a semiconductor package according to some embodiments of the present inventive concepts.

FIG. 10 illustrates a cross-sectional view showing a semiconductor package according to some embodiments of the present inventive concepts. Except the following description, omission will be made to avoid repetitive explanations of components discussed with reference to FIGS. 1A to 1D.

Referring to FIG. 10, a semiconductor package 3 may include a first semiconductor package 1000 and a second semiconductor package 2000 on the first semiconductor package 1000.

The first semiconductor package 1000 may include a first redistribution substrate 100, a first semiconductor chip 200, a second passivation layer 240, a connection substrate 300, a first molding layer 400, an external connection terminal 130, and a second redistribution substrate 500.

The second redistribution substrate 500 may include second redistribution dielectric layers 501 and second redistribution patterns 510 interposed between the second redistribution dielectric layers 501.

The second redistribution dielectric layers 501 may be stacked one atop another. FIG. 10 depicts two second redistribution dielectric layers 501, but one second redistribution dielectric layer 501 or more than two second redistribution dielectric layers 501 may be included. No interface may appear between the second redistribution dielectric layers 501. For example, the second redistribution dielectric layers 501 may be observed as one dielectric layer. The second redistribution dielectric layers 501 may include, for example, a photo-imagable dielectric (PID) material. The photo-imagable dielectric material may include at least one selected from photosensitive polyimide, polybenzoxazole, phenolic polymers, and benzocyclobutene polymers.

Each of the second redistribution patterns 510 may include a second wire portion 512 and a second via portion 511 that are connected into a single unitary body. The second wire portion 512 may be provided on and connected to the second via portion 511. The second via portion 511 may be a part that protrudes from the second wire portion 512 toward a top surface of the first redistribution substrate 100. Lowermost ones of the second redistribution patterns 510 may be connected to the upper pads 342. For example, bottom surfaces of lowermost second via portions 511 may be in contact with top surfaces of the upper pads 342. The second redistribution substrate 500 may be electrically connected to the connection substrate 300. The second redistribution substrate 500 may be electrically connected through the connection substrate 300 to the first redistribution substrate 100 and the first semiconductor chip 200. The second wire portion 512 and the second via portion 511 may include the same material, for example, copper (Cu).

The second semiconductor package 2000 may include a package substrate 601, a first connection terminal 520, a second semiconductor chip 700, a second connection terminal 820, an under-fill layer 810, and a second molding layer 900.

The package substrate 601 may be provided on the second redistribution substrate 500. The package substrate 601 may be a printed circuit board or a redistribution substrate. The package substrate 601 may include a first pad 603 at or adjacent to a top surface of the package substrate 601 and a second pad 605 at or adjacent to a bottom surface of the package substrate 601. The first pad 603 and the second pad 605 may include a metallic material, such as aluminum.

The first connection terminal 520 may be interposed between the package substrate 601 and the second redistribution substrate 500. The first connection terminal 520 may be in contact with the second pad 605 and the second redistribution patterns 510. The first connection terminal 520 may be electrically connected to the second pad 605 and the second redistribution patterns 510. The first connection terminal 520 may be electrically connected through the second redistribution patterns 510 to the second redistribution substrate 500. The first connection terminal 520 may be electrically connected through the second redistribution substrate 500 to the connection substrate 300, the first redistribution substrate 100, and the first semiconductor chip 200.

The second semiconductor chip 700 may be provided on the package substrate 601. The second semiconductor chip 700 may include a second body 701 and a second chip pad 710 at or adjacent to a bottom surface of the second body 701. The second body 701 may include, for example, silicon (Si), germanium (Ge), or gallium-arsenic (GaAs). The second chip pad 710 may include metal, such as aluminum.

The second connection terminal 820 may be interposed between the package substrate 601 and the second semiconductor chip 700. The second connection terminal 820 may be in contact with the first pad 603 and the second chip pad 710. The second connection terminal 820 may be electrically connected through the first pad 603 to the package substrate 601. The second connection terminal 820 may be electrically connected through the second chip pad 710 to the second semiconductor chip 700. The second semiconductor chip 700 may be electrically connected to the first semiconductor chip 200 and the external connection terminal 130 through the second connection terminal 820, the package substrate 601, the first connection terminal 520, the second redistribution substrate 500, the connection substrate 300, and the first redistribution substrate 100.

The under-fill layer 810 may be interposed between the second semiconductor chip 700 and the package substrate 601. The under-fill layer 810 may cover a lateral or side surface of the second connection terminal 820. The under-fill layer 810 may include an under-fill material. The under-fill material may include, for example, at least one selected from a non-conductive film (NCF), a non-conductive paste (NCP), a B-stage under-fill, a capillary under-fill, a fluxing under-fill, and a hybrid under-fill.

The second molding layer 900 may cover the second semiconductor chip 700, the under-fill layer 810, and the package substrate 601. The second molding layer 900 may cover top and lateral or side surfaces of the second semiconductor chip 700. The second molding layer 900 may cover a lateral or side surface of the under-fill layer 810. The second molding layer 900 may cover a portion of the top surface of the package substrate 601. The second molding layer 900 may include a thermosetting resin such as epoxy resin, a thermoplastic resin such as polyimide, or a resin such as prepreg, Ajinomoto build-up film (ABF), flame-retardant 4 (FR4), or bismaleimide triazine (BT), in which a thermosetting or thermoplastic resin is impregnated into a core material such as inorganic filler or glass fiber (or glass cloth, glass fabric, etc.).

When a molding layer enters below a semiconductor chip to fill a space between bumps of the semiconductor chips, in a subsequent process, a delamination phenomenon may occur due to a difference in thermal expansion efficient between the molding layer, the semiconductor chip, and the bump. The delamination phenomenon may interrupt bond of a redistribution substrate in a subsequent redistribution process. In the present inventive concepts, as a second passivation layer covers a pillar, a first molding layer may not enter below the first semiconductor chip. Therefore, the delamination phenomenon may be prevented to increase reliability of a semiconductor package.

In the present inventive concepts, the second passivation layer may eliminate a step difference caused by the pillar, and a surface planarization may remove a recess that is present in a dielectric layer. Accordingly, it may be possible to easily form fine patterns of a redistribution substrate.

There may be a reduction in the number of process steps for forming a panel having pads that protrude onto opposite sides thereof, as compared to process steps for forming a panel having embedded pads. According to the present inventive concepts, even when the protruding lower pads cause to create the recess on the dielectric layer, the surface planarization may be performed to remove the recess. Accordingly, it may be possible to use a connection substrate including the upper and lower pads that protrude from surfaces thereof, which may result in a reduction in manufacturing cost Although the present inventive concepts have been described in connection with some embodiments of the present inventive concepts illustrated in the accompanying drawings, it will be understood to those skilled in the art that various changes and modifications may be made without departing from the scope of the present inventive concepts.

What is claimed is:

1. A semiconductor package, comprising:
  a redistribution substrate;
  a semiconductor chip on the redistribution substrate, the semiconductor chip including a body, a chip pad on a bottom surface of the body, and a pillar on a bottom surface of the chip pad;
  a connection substrate on the redistribution substrate and surrounding the semiconductor chip, the connection substrate including base layers and a lower pad on a bottom surface of a lowermost one of the base layers;
  a first passivation layer between the semiconductor chip and the redistribution substrate, the first passivation layer covering a side surface of the pillar;
  a molding layer at least partially covering the semiconductor chip, the connection substrate, and the redistribution substrate; and
  a dielectric layer between the redistribution substrate and the connection substrate, the dielectric layer covering a side surface of the lower pad,
  wherein the first passivation layer and the dielectric layer include different materials from each other, and
  wherein a bottom surface of the pillar, a bottom surface of the first passivation layer, a bottom surface of the molding layer, a bottom surface of the lower pad, and a bottom surface of the dielectric layer are coplanar with each other.

2. The semiconductor package of claim 1, wherein the pillar includes copper (Cu) and/or tin (Sn).

3. The semiconductor package of claim 1, wherein the connection substrate includes:
  an upper pad on a top surface of an uppermost one of the base layers;
  a via that penetrates at least one of the base layers; and
  a wire pattern between the base layers and coupled to the via.

4. The semiconductor package of claim 3, wherein
  the upper pad and the lower pad include copper, and
  the bottom surface of the lower pad protrudes a thickness of about 3 μm to about 10 μm from the bottom surface of the lowermost one of the base layers.

5. The semiconductor package of claim 1, wherein the first passivation layer includes at least one selected from a non-conductive film (NCF), a non-conductive paste (NCP), a B-stage under-fill, a capillary under-fill, a fluxing under-fill, and a hybrid under-fill.

6. The semiconductor package of claim 1, wherein the dielectric layer includes a photo-imageable dielectric (PID) material,
  wherein the photo-imageable dielectric material includes at least one selected from photosensitive polyimide, polybenzoxazole, phenolic polymers, and benzocyclobutene polymers.

7. The semiconductor package of claim 1, wherein
  the redistribution substrate includes redistribution dielectric layers and redistribution patterns, and
  the lower pad and the pillar are in contact with an uppermost one of the redistribution patterns.

8. The semiconductor package of claim 1, further comprising a second passivation layer between the body and the first passivation layer, the second passivation layer at least partially covering a side surface of the chip pad,
  wherein a bottom surface of the second passivation layer is at a vertical level the same as or higher than a vertical level of the bottom surface of the chip pad.

9. The semiconductor package of claim 1, wherein
  a thickness of the chip pad is in a range of about 1 μm to about 4 μm, and
  a thickness of the pillar is in a range of about 3 μm to about 40 μm.

10. The semiconductor package of claim 1, wherein the molding layer is in a space between the semiconductor chip and the connection substrate and is absent in a space between the semiconductor chip and the redistribution substrate.

11. The semiconductor package of claim 1, wherein a top surface of the first passivation layer is at a vertical level the same as or higher than a vertical level of the bottom surface of the chip pad.

12. A semiconductor package, comprising:
  a first semiconductor package; and
  a second semiconductor package on the first semiconductor package,
  wherein the first semiconductor package includes:
    a first redistribution substrate;
    a first semiconductor chip on the first redistribution substrate, the first semiconductor chip including a body that includes a first surface adjacent the first redistribution substrate and an opposite second surface, a chip pad on the first surface of the body, a first passivation layer at least partially covering the first surface of the body and a side surface of the chip pad, and a pillar below the chip pad;
    a second passivation layer between the first semiconductor chip and the first redistribution substrate, the second passivation layer covering a side surface of the pillar;
    a connection substrate on the first redistribution substrate, the connection substrate surrounding the first semiconductor chip;

a first molding layer at least partially covering the first semiconductor chip, the connection substrate, and the first redistribution substrate; and a second redistribution substrate on the first molding layer, wherein the second semiconductor package includes:

a package substrate on the second redistribution substrate;

a second semiconductor chip on the package substrate; and a second molding layer at least partially covering the package substrate and the second semiconductor chip, wherein a thickness of the first passivation layer is less than a thickness of the second passivation layer, and wherein the first passivation layer and the second passivation layer include different materials from each other.

13. The semiconductor package of claim 12, wherein the connection substrate includes a lower pad protruding from a bottom surface of the connection substrate, and the first molding layer extends between a top surface of the first redistribution substrate and the bottom surface of the connection substrate, the first molding layer covering a side surface of the lower pad.

14. The semiconductor package of claim 12, wherein a bottom surface of the pillar, a bottom surface of the second passivation layer, and a bottom surface of the first molding layer are coplanar with each other.

* * * * *